(12) United States Patent
Ikeda et al.

(10) Patent No.: US 11,548,827 B2
(45) Date of Patent: Jan. 10, 2023

(54) MEMBER FOR PLASMA PROCESSING APPARATUS AND PLASMA PROCESSING APPARATUS WITH THE SAME

(71) Applicants: NIPPON TUNGSTEN CO., LTD., Fukuoka (JP); TOKYO ELECTRON LIMITED, Tokyo (JP)

(72) Inventors: Takashi Ikeda, Fukuoka (JP); Hajime Ishii, Fukuoka (JP); Kenji Fujimoto, Fukuoka (JP); Naoyuki Satoh, Miyagi (JP); Nobuyuki Nagayama, Miyagi (JP); Koichi Murakami, Miyagi (JP); Takahiro Murakami, Miyagi (JP)

(73) Assignees: NIPPON TUNGSTEN CO., LTD., Fukuoka (JP); TOKYO ELECTRON LIMITED, Tokyo (JP)

( * ) Notice: Subject to any disclaimer, the term of this patent is extended or adjusted under 35 U.S.C. 154(b) by 176 days.

(21) Appl. No.: 16/830,205

(22) Filed: Mar. 25, 2020

(65) Prior Publication Data
US 2020/0317583 A1    Oct. 8, 2020

(30) Foreign Application Priority Data
Apr. 4, 2019    (JP) ............................. JP2019-072006

(51) Int. Cl.
| C04B 35/56 | (2006.01) |
| C23F 4/00 | (2006.01) |
| H01L 21/67 | (2006.01) |
| H01J 37/32 | (2006.01) |

(52) U.S. Cl.
CPC ............ *C04B 35/5626* (2013.01); *C23F 4/00* (2013.01); *H01L 21/67069* (2013.01); *C04B 2235/3847* (2013.01); *C04B 2235/405* (2013.01); *C04B 2235/963* (2013.01); *C04B 2235/9669* (2013.01); *H01J 37/3244* (2013.01); *H01J 37/32477* (2013.01); *H01J 37/32642* (2013.01); *H01J 37/32715* (2013.01); *H01J 2237/2007* (2013.01); *H01J 2237/334* (2013.01)

(58) Field of Classification Search
CPC ........ C04B 35/5626; C04B 2235/3847; C04B 2235/405; C04B 2235/963; C04B 2235/9669; H01L 21/67069
See application file for complete search history.

(56) References Cited

U.S. PATENT DOCUMENTS

| 2002/0059905 A1 | 5/2002 | Gorokhovsky |
| 2011/0111945 A1* | 5/2011 | Peterson ............. C04B 35/5626 |
| | | 264/432 |

(Continued)

FOREIGN PATENT DOCUMENTS

| JP | S62-047130 A | 2/1987 |
| JP | H6-065710 A | 3/1994 |
| JP | H8-236599 A | 9/1996 |

(Continued)

*Primary Examiner* — Karl E Group
*Assistant Examiner* — Cameron K Miller
(74) *Attorney, Agent, or Firm* — Squire Patton Boggs (US) LLP

(57) ABSTRACT

Provided is a member for a plasma processing apparatus consisting of a tungsten carbide phase. The member includes at least one type of atom selected from the group consisting of a Fe atom, a Co atom, and a Ni atom, in which the total content of the atoms is in a range of 30 to 3300 atomic ppm.

8 Claims, 3 Drawing Sheets

(56) References Cited

U.S. PATENT DOCUMENTS

2014/0315392 A1 10/2014 Xu et al.
2018/0122680 A1 5/2018 Yang

FOREIGN PATENT DOCUMENTS

| JP | 2001-135619 A | 5/2001 |
| JP | 2018-056333 A | 4/2018 |
| JP | 2018-107433 A | 7/2018 |
| KR | 10-1849038 B1 | 4/2018 |

* cited by examiner

MEMBER FOR PLASMA PROCESSING APPARATUS AND PLASMA PROCESSING APPARATUS WITH THE SAME

PRIORITY

This application is a United States application which claims priority to JP Application No. 2019-072006, filed on Apr. 4, 2019, which is incorporated verbatim herein by reference in its entirety, including the specification, drawings, and the claims.

TECHNICAL FIELD

The present disclosure relates to a member for a plasma processing apparatus, a plasma processing apparatus provided with the member, and a method for using a sintered body.

BACKGROUND

A member which is provided in a chamber of a plasma etching apparatus or the like in manufacture of a semiconductor is exposed to an erosion environment due to plasma of an etching gas which is used in a semiconductor pattern formation or the like. If such a member is made of a material that reacts with an etchant, it contaminates the inside of the chamber and an etching processing object (for example, a semiconductor wafer), causing insulation failure and shape failure. In order to suppress such a phenomenon, use of silicon (Si) or quartz as the member has been studied.

For example, Japanese Unexamined Patent Publication No. 2001-135619 proposes an edge ring made of single-crystal silicon in order to prevent contamination by impurities such as heavy metal. Japanese Unexamined Patent Publication No. S62-047130 proposes to use SiC, WC, TiC, or the like as a material of a wafer ring. In Japanese Unexamined Patent Publication No. 2018-107433, SiC, Si, $SiO_2$, W, WC, and the like are mentioned as materials of an edge ring. In addition to these materials, there are also known members obtained by spraying yttrium oxide having high corrosion resistance onto aluminum or an aluminum alloy which is inexpensive and is easily manufactured, alumite-treated aluminum, or a base material such as aluminum.

SUMMARY

However, among the materials described above, aluminum does not have sufficient corrosion resistance to plasma, and there is a concern that the frequency of replacement of members due to consumption may increase. Although it is conceivable to provide a corrosion-resistant layer as a countermeasure, if the corrosion-resistant layer is provided, the generation of particles or the like is a concern. Further, metal ions such as aluminum and yttrium adversely affect a semiconductor circuit and can cause malfunction and operation failure.

Since silicon and quartz are also easily eroded by plasma, the frequency of replacement of members increases. Further, among ceramics, tungsten carbide (WC) is an excellent material that has high strength and has high conductivity, so that static electricity is also not easily generated. However, WC itself has a high melting point and is a hardly sinterable material, and thus it is relatively difficult to obtain a sintered body having few pores serving as particle pockets. In a so-called cemented carbide obtained by adding a certain amount of a metal binder such as Co or Ni to WC, it is possible to reduce pores, there is a concern that a metal binder component such as Co or Ni may contaminate the inside of the chamber of the plasma processing apparatus and serve as a factor of particle generation. Such metal contamination easily occurs particularly in a case where the metal component is contained as a "phase". This is because an etching rate to a plasma gas is different between a carbide phase and a metal phase, and in the case of the metal phase, a metal portion is preferentially corroded and a large amount of pollutant metal is released.

Therefore, the present disclosure provides a member for a plasma processing apparatus, which has excellent corrosion resistance to plasma processing, and in which it is possible to sufficiently suppress metal contamination of the inside of the plasma processing apparatus. Further, the present disclosure provides a plasma processing apparatus which has excellent corrosion resistance and in which it is possible to sufficiently suppress metal contamination of the inside of the apparatus. Further, the present disclosure provides a method for using a sintered body which has excellent corrosion resistance to plasma processing and in which it is possible to sufficiently suppress metal contamination of the inside of a plasma processing apparatus, as a member of the plasma processing apparatus.

According to an aspect, the present disclosure provides a member (sintered body) for a plasma processing apparatus consisting of a tungsten carbide phase, the member including at least one type of atom selected from the group consisting of a Fe atom, a Co atom, and a Ni atom, in which a total content of the atoms is in a range of 30 to 3300 atomic ppm.

Since the member is consisting of the tungsten carbide phase, the member has excellent corrosion resistance to plasma processing. Further, if a plurality of phases are contained, particle pockets easily occur due to a difference in etching rate. However, since the member of the present disclosure is consisting of one phase, it is possible to make it difficult to generate particle pockets. Here, tungsten carbide itself is hardly sinterable, the ratio of pores tends to become high, and there is a case where the pores become particle pockets. However, the member of the present disclosure includes a predetermined amount of at least one type of atom selected from the group consisting of the Fe atom, the Co atom, and the Ni atom. In this way, sintering of tungsten carbide can be promoted to reduce a porosity, and thus it is possible to suppress generation of particle pockets. Further, there is an upper limit on the total content of the Fe atoms, the Co atoms, and the Ni atoms. Due to these factors, it is possible to sufficiently suppress metal contamination of the inside of the plasma processing apparatus.

According to another aspect, the present disclosure provides a plasma processing apparatus including the member described above. This plasma processing apparatus includes the above member. For this reason, it is possible to provide a plasma processing apparatus which has excellent corrosion resistance and in which it is possible to sufficiently suppress contamination of the inside of the apparatus.

According to still another aspect, the present disclosure provides a method for using a sintered body as a member of a plasma processing apparatus, the sintered body being consisting of a tungsten carbide phase and including at least one type of atom selected from the group consisting of a Fe atom, a Co atom, and a Ni atom, in which a total content of the atoms is in a range of 30 to 3300 atomic ppm.

Since the sintered body is consisting of the tungsten carbide phase, the sintered body has excellent corrosion resistance to plasma processing. Further, if a plurality of phases are contained, particle pockets easily occur due to a difference in etching rate. However, since the sintered body is consisting of one phase, it is possible to make it difficult to generate particle pockets. Here, tungsten carbide itself is hardly sinterable, the ratio of pores tends to become high, and there is a case where the pores become particle pockets. However, the sintered body includes a predetermined amount of at least one type of atom selected from the group consisting of the Fe atom, the Co atom, and the Ni atom. In this way, sintering of tungsten carbide can be promoted to reduce a porosity, and thus it is possible to suppress generation of particle pockets. Further, there is an upper limit on the total content of the Fe atoms, the Co atoms, and the Ni atoms. Due to these factors, it is possible to sufficiently suppress metal contamination of the inside of the plasma processing apparatus.

According to the present disclosure, it is possible to provide a member for a plasma processing apparatus, which has excellent corrosion resistance to plasma processing, and in which it is possible to sufficiently suppress metal contamination of the inside of the plasma processing apparatus. Further, it is possible to provide a plasma processing apparatus which is excellent in corrosion resistance and in which it is possible to sufficiently suppress metal contamination of the inside of the apparatus. Further, it is possible to provide a method for using a sintered body which has excellent corrosion resistance to plasma processing and in which it is possible to sufficiently suppress metal contamination of the inside of a plasma processing apparatus, as a member of the plasma processing apparatus.

DETAILED DESCRIPTION

Figure 1:
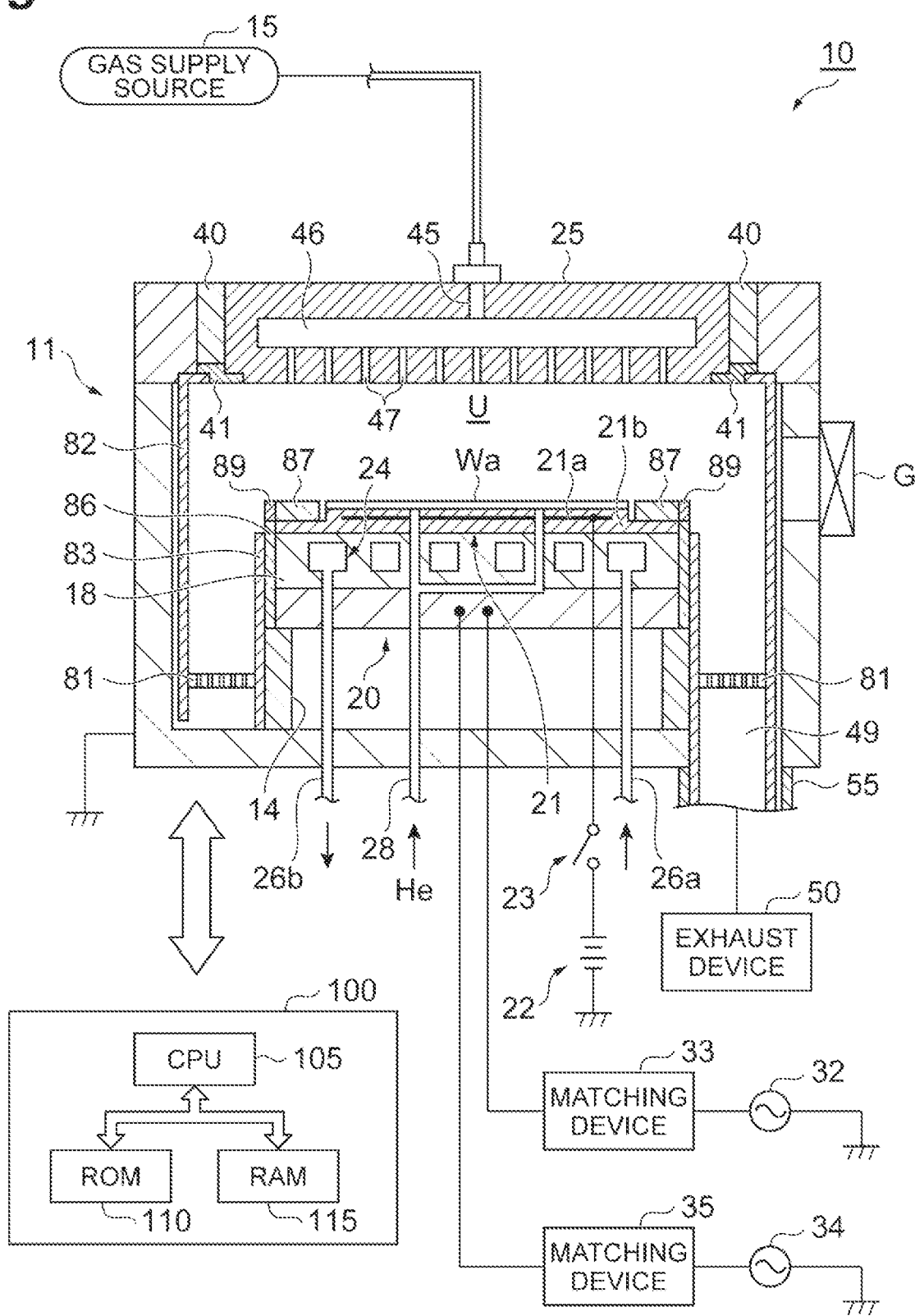
FIG. 1 is a schematic sectional view showing an embodiment of a plasma processing apparatus.

Hereinafter, an embodiment of the present disclosure will be described with reference to the drawings as necessary. However, the following embodiment is exemplification for describing the present disclosure and is not intended to limit the present disclosure to the following contents.

A member for a plasma processing apparatus according to an embodiment of the present disclosure is configured with a sintered body and is consisting of a tungsten carbide phase. The tungsten carbide phase (WC phase) in the present disclosure is a crystal phase of tungsten carbide. That is, the member of the present embodiment does not contain crystal phases other than the WC phase. Since the WC phase has excellent corrosion resistance to plasma etching, the life of the member can be prolonged. The member contains a predetermined amount of at least one type of atom selected from the group consisting of a Fe atom, a Co atom, and a Ni atom. These atoms may be in a solid solution in the WC phase or may be at grain boundaries of the crystals of the WC phase. The concentration of these atoms at the grain boundary may be higher than the concentration of the WC phase in the crystal in a range in which a phase is not formed. The total content of the Fe atoms, the Co atoms and the Ni atom in the member may be in a range of 30 to 3300 atomic ppm, may be in a range of 30 to 2100 atomic ppm, or may be in a range of 30 to 1650 atomic ppm.

By setting the total content of the above atoms to 30 atomic ppm or more, sintering of tungsten carbide which is a hardly sinterable material can be promoted to reduce the porosity. On the other hand, if the content of the above atoms becomes excessive, a heterogeneous phase such as a metal phase is formed, and the portion is preferentially subjected to plasma etching. As a result, irregularities are generated on the surface of the member, resulting in particle pockets. Further, the metal phase is plasma-etched, and the metal ions float and tend to become sources of contamination of an etching processing object such as a semiconductor wafer.

Therefore, in the present embodiment, by setting the total content of the above atoms to 3300 atomic ppm or less, generation of phases other than the tungsten carbide phase can be suppressed, and thus it is possible to suppress metal contamination of the inside of the plasma processing apparatus. By setting the total content of the above atoms to 2100 atomic ppm or less, it is possible to sufficiently suppress metal contamination of the inside of the plasma processing apparatus. By setting the total content of the above atoms to 1650 atomic ppm or less, it is possible to more sufficiently suppress metal contamination of the inside of the plasma processing apparatus. The content of each atom in the member can be measured by glow discharge mass spectrometry (GDMS).

The "corrosion resistance" in the present disclosure means corrosion resistance to plasma processing using a fluorocarbon-based or halogen-based etching gas or the like.

From the viewpoint of further suppressing metal contamination of the inside of the apparatus, the content of each of the Fe atom, the Co atom, and the Ni atom in the member may be 1650 atomic ppm or less, may be 1200 atomic ppm or less, or may be 1000 atomic ppm or less. On the other hand, from the viewpoint of reducing the manufacturing cost of the member, the content of each of the Fe atom, the Co atom, and the Ni atom in the member may be 30 atomic ppm or more, or may be 300 atomic ppm or more.

The member of the present embodiment may not include metal atoms other than W atoms, Fe atoms, Co atoms, and Ni atoms. The total amount of the metal atoms other than W atoms, Fe atoms, Co atoms, and Ni atoms may be 1650 atomic ppm or less from the viewpoint of more sufficiently suppressing metal contamination of the inside of the plasma processing apparatus. Further, the content of each of the metal atoms other than W atoms, Fe atoms, Co atoms, and Ni atoms may be 300 atomic ppm or less.

The porosity of the member may be 2% by volume or less from the viewpoint of reducing particle pockets associated with plasma processing. The porosity may be in a range of 0.05 to 1% by volume or may be 0.1 to 0.5% by volume, from the viewpoint of reducing the manufacturing cost while sufficiently reducing particle pockets associated with plasma processing. The porosity can be calculated by polishing a cross section of the member and observing an image of the polished surface with a scanning electron microscope.

The member of the present embodiment is consisting of the WC phase having excellent corrosion resistance to the plasma processing. For this reason, the etching rate of the member is extremely low, and the life can be extended as compared with a member made of silicon, for example. Further, as compared with a case of containing a plurality of phases, it is possible to make it difficult to generate irregularities on the surface of the member due to a difference in etching rate. For this reason, it is possible to make it difficult to generate particle pockets and to suppress metal contamination. Further, since the iron group atoms (Fe atoms, Co atoms, and Ni atoms) having the effect of promoting sintering are contained, pores which cause generation of particle pockets in the member can be sufficiently reduced as compared with pure tungsten carbide. By using such a member in a plasma processing apparatus, contamination of an etching processing object and the inside of the apparatus is reduced, and the quality and yield of manufactured products by a semiconductor manufacturing process can be improved.

When plasma etching is performed by a plasma processing apparatus, there is a case where a material containing tungsten is used as a mask material. In this case, since tungsten is used in the chamber, processing of removing tungsten is performed on the etching processing object. For this reason, contamination caused by the inclusion of tungsten in the member can be removed by the above processing without newly adding a cleaning step.

An example of a method of manufacturing a member for a plasma processing apparatus will be described below. As a raw material tungsten carbide powder is prepared. From the viewpoint of sufficiently reducing metal contamination, the purity of the tungsten carbide powder may be 99.9% by mass or more. The average particle diameter may be in a range of about 0.1 to 4 µm from the viewpoint of sinterability and handleability.

As a method of adding the iron group metal (Fe, Ni, Co), the metal in a powder state may be mixed, or the metal may be mixed in from a medium in a mixing and stirring step to be described later. Further, powder of a compound containing an iron group element as a constituent element may be mixed, or the compound may be mixed in an ionic state in an aqueous solution or the like. In this manner, the form of the raw material is not particularly limited. In the case of mixing the metal in a powder state, powder having an average particle diameter in a range of about 0.5 to 5 µm may be used. As the amount of addition, the total content of the iron group atoms may be in a range of about 30 to 3500 atomic ppm in the state of the mixed powder (described later), in consideration of the fact that there is some vaporization and scattering until the time of the end of sintering.

For example, tungsten carbide powder and iron group metal powder which is added as necessary are mixed and stirred by a known dry type or wet type method. Thereafter, a molding raw material is obtained by drying or adding an organic binder for molding, as necessary. In a case where the iron group metal is added in a powder state or in the form of an aqueous solution or the like, it may be mixed with tungsten carbide powder and mixed and stirred.

Subsequently, the molding raw material is subjected to pressure molding to obtain a molded body. The pressure molding may be performed using a mold and a press machine, or a wet type press machine using hydrostatic pressure may be used. The maximum pressurization at the time of pressing can be performed in a range of about 10 to 500 MPa. If necessary, degreasing, temporary sintering, and intermediate processing can be performed on the obtained molded body.

The molded body or a treated body subjected to degreasing, calcination, and intermediate processing is put in a sintering furnace and sintered. The sintering can be performed in a non-oxidizing atmosphere (a hydrogen gas atmosphere, an ammonia gas atmosphere, a vacuum atmosphere with carbon interposed, a rare gas atmosphere, or the like). The maximum temperature during the sintering may be in a range of about 1800 to 2400° C. because tungsten carbide is a hardly sinterable material.

After the sintering, the sintered body may be subjected to HIP (Hot Isostatic Pressing) treatment to further reduce residual pores. Further, in the case of uses and shapes that require dimensional accuracy, the sintered body may be subjected to various known surface treatments such as machining and electric machining. In this way, a member for a plasma processing apparatus, which is configured with a sintered body, is obtained. The method of manufacturing the member is not limited to the example described above, and a hot press method or an SPS method (spark plasma sintering method) may be used depending on the shape.

There is a case where tungsten carbide partially reacts at a high temperature during sintering. For this reason, a component ratio in the molding raw material and a component ratio in the member may not coincide with each other. This is based on various factors such as the fact that tungsten carbide is not originally a compound having an ideal $W_1C_1$ ratio (the stoichiometric ratio of C is less than 1 with respect to the stoichiometric ratio of W, which is 1), the fact that carbon is exchanged with the atmosphere (also including a firing jig or the like) during firing, and the fact that exchange of carbon between tungsten carbide and a carbon source other than tungsten carbide occurs.

The ratio of the input raw materials and the sintering conditions may be adjusted such that the sintered body is consisting of a tungsten carbide phase. Since the sintered body which is obtained in this way has sufficient corrosion resistance to plasma processing, the generation of particle pockets and the metal contamination can be sufficiently suppressed during the plasma processing. For this reason, the sintered body can be suitably used as a member for a plasma processing apparatus which is used in a semiconductor manufacturing process. As specific members, an edge ring which is installed around a semiconductor wafer, an electrostatic chuck for attracting a semiconductor, a base material for placing a wafer, a shower plate serving as a process gas supply part for etching, a stein of a water jacket part with a structure in which cooling water flow, an inner wall material of a chamber, and the like can be given as examples.

FIG. 1 is a longitudinal sectional view showing an example of a plasma processing apparatus 10 according to an embodiment. The plasma processing apparatus 10 of the present embodiment is a capacitively coupled (CCP: Capacitively Coupled Plasma) parallel plate plasma processing apparatus. In the plasma processing apparatus 10, a gas is converted into plasma in a chamber 11, and a wafer Wa placed on a placing table 20 is processed by the action of the plasma. The wafer Wa is, for example, a semiconductor wafer. The plasma processing apparatus 10 is an example of a processing apparatus.

The plasma processing apparatus 10 has a substantially cylindrical chamber 11. The inner surface of the chamber 11 is subjected to alumite treatment (anodizing treatment). A processing chamber U in which plasma etching processing, film formation processing, and the like are performed on the wafer Wa is defined in the chamber 11.

The placing table 20 has a base 18 and an electrostatic chuck 21 and the wafer Wa is placed thereon. The placing table 20 also functions as a lower electrode.

The electrostatic chuck 21 is provided on the base 18. The electrostatic chuck 21 has a structure in which a chuck electrode 21a is interposed between insulators 21b. A direct-current power source 22 is connected to the chuck electrode 21a through a switch 23, and when the switch 23 is turned on, a direct-current voltage is applied from the direct-current power source 22 to the chuck electrode 21a. In this way, the wafer Wa is attracted to the electrostatic chuck 21 by a Coulomb force.

An annular edge ring 87 is placed on a placing surface of the outer periphery of the electrostatic chuck 21 around the wafer Wa. The edge ring 87 is also called a focus ring, and functions to converge the plasma in the processing chamber U toward the surface of the wafer Wa and to improve the efficiency of the plasma processing.

The placing table 20 is held on a bottom portion of the chamber 11 by a support 14. A refrigerant flow path 24 is formed in the interior of the base 18. A cooling medium such as cooling water and brine, for example, which is output from a chiller unit, flows through a refrigerant inlet pipe 26a, the refrigerant flow path 24, and a refrigerant outlet pipe 26b, returns to the chiller unit, is controlled to a predetermined temperature, and circulates through the path described above. In this way, the placing table 20 is radiated in heat and cooled.

A heat transfer gas such as helium gas (He) which is supplied from a heat transfer gas supply source is supplied to the gap between the placing surface of the electrostatic chuck 21 and the back surface of the wafer Wa through a gas supply line 28. The temperature of the wafer Wa is controlled to a predetermined temperature by the cooling medium circulating through the refrigerant flow path 24 and the heat transfer gas which is supplied to the back surface of the wafer Wa.

A first radio frequency power source 32 is electrically connected to the placing table 20 through a first matching device 33 and applies radio frequency power for plasma generation HF having a first frequency (for example, 40 MHz) to the placing table 20. Further, a second radio frequency power source 34 is electrically connected to the placing table 20 through a second matching device 35 and applies radio frequency power for bias voltage generation LF having a second frequency (for example, 13.56 MHz) lower than the first frequency to the placing table 20.

The first matching device 33 matches the load impedance on the plasma side with the internal impedance of the first radio frequency power source 32. The second matching device 35 matches the load impedance on the plasma side with the internal impedance of the second radio frequency power source 34.

A gas shower head 25 is mounted to close an opening of a ceiling portion of the chamber 11 through a cylindrical shield ring 40 provided at an outer edge thereof. The gas shower head 25 also functions as a counter electrode (an upper electrode) facing the placing table 20 (the lower electrode). A top shield ring 41 is disposed on the lower surface of the shield ring 40 at a peripheral portion of the gas shower head 25.

A gas introduction port 45 for introducing a gas is formed in the gas shower head 25. A diffusion chamber 46 is provided in the interior of the gas shower head 25. A gas output from a gas supply source 15 is supplied to the diffusion chamber 46 through the gas introduction port 45, is diffused in the diffusion chamber 46, and is introduced from a plurality of gas supply holes 47 into the processing chamber U in the chamber 11.

An exhaust port 55 is formed on the bottom surface of the chamber 11, and the inside of the chamber 11 is exhausted by an exhaust device 50 connected to the exhaust port 55. In this way, the inside of the chamber 11 can be maintained at a predetermined degree of vacuum. A gate valve G is provided on the side wall of the chamber 11, and the wafer Wa is transferred from a transfer port into the chamber 11 or out of the chamber 11 by opening and closing the gate valve G.

A cylindrical insulator ring 86 is disposed to cover the outer peripheral side surface of the placing table 20. Further, a cylindrical cover ring 89 is disposed to cover the outer peripheral side surface of the edge ring 87.

A deposit shield 82 is provided along the inner wall surface at the side portion of the chamber 11. Further, a deposit shield 83 is provided along the outer peripheral side surfaces of the placing table 20 and the support 14. The deposit shields 82 and 83 are configured to be detachable. The deposit shields 82 and 83 prevent by-products (deposits) generated by plasma etching processing or the like executed in the chamber 11 from adhering to the inner wall of the chamber 11.

An annular baffle plate 81 is provided in an annular exhaust path between the deposit shields 82 and 83. The exhaust port 55 is provided in an exhaust path 49 below the baffle plate 81.

The plasma processing apparatus 10 is provided with a control unit 100 for controlling the operation of the entire apparatus. The control unit 100 has a CPU (Central Processing Unit) 105, a ROM (Read Only Memory) 110, and a RAM (Random Access Memory) 115. The CPU 105 executes desired plasma processing such as etching according to a recipe stored in a storage area such as the RAM 115. A process time, pressure (gas exhaust), radio frequency power or voltage, various gas flow rates, a temperature in a chamber, a cooling medium temperature, and the like, which are control information of the apparatus with respect to process conditions, are set in the recipe.

When the plasma processing is executed, the opening and closing of the gate valve G is controlled, and the wafer Wa is loaded into the chamber 11 and placed on the placing table 20. If a direct-current voltage is applied from the direct-current power source 22 to the chuck electrode 21a, the wafer Wa is attracted to and held by the electrostatic chuck 21.

The processing gas is supplied from the gas supply source 15 into the chamber 11. The radio frequency power HF is applied from the first radio frequency power source 32 to the placing table 20, and the radio frequency power LF is applied from the second radio frequency power source 34 to the placing table 20. In this way, plasma is generated in the processing chamber U, and plasma processing is performed on the wafer Wa by the action of the plasma.

After the plasma processing, a direct-current voltage having a polarity reverse to the polarity when attracting the wafer Wa is applied from the direct-current power source 22 to the chuck electrode 21a and the charges of the wafer Wa are eliminated. In this way, the wafer Wa is peeled off from the electrostatic chuck 21 and is unloaded to the outside of the chamber 11 through the gate valve G.

In the plasma processing apparatus 10, each component which is exposed to the plasma processing may be configured with the member according to the embodiment described above. For example, at least one selected from the group consisting of the edge ring 87, the cover ring 89, the baffle plate 81, the gas shower head 25, the top shield ring 41, the deposit shield 82, and the deposit shield 83 may be configured with the member (sintered body) described above. The plasma processing apparatus is not limited to that shown in FIG. 1, and the member described above can be used in various semiconductor manufacturing apparatuses that perform plasma processing. The component to which the member is applied is also not particularly limited, and may be applied to, for example, a shower plate, a base, an inner wall of a processing container, and the like. By using the above-described sintered body in the plasma processing apparatus, it is possible to improve the corrosion resistance of the component of the plasma processing apparatus 10 and to sufficiently suppress the metal contamination of the etching processing object such as the wafer Wa and the inside of the apparatus.

In another aspect, the above-described embodiment can be a method for using the sintered body as a member of a plasma processing apparatus. An embodiment of the present disclosure has been described above. However, the present disclosure is not limited to the above embodiment.

EXAMPLE

The contents of the present invention will be described in more detail with reference to examples and comparative examples. However, the present invention is not limited to the examples described below.

Examples 1 to 14

[Preparation of Raw Materials]

Commercially available WC powder (average particle diameter: 0.6 μm, Co content: 150 atomic ppm) was prepared. 5000 g of WC powder and 1800 ml of methanol were put in a 5 L binderless cemented carbide lining pot, and pulverized by a ball mill (rotational speed: 64 rpm), and the relationship between a pulverization time (0 to 50 hours) and a Co content was examined. As the material of the ball, a binderless cemented carbide material and a cemented carbide material containing a binder (Co 13% by mass) were used, and the amount of binder component mixed into the WC powder due to a difference in the material of the ball was examined.

Figure 2:
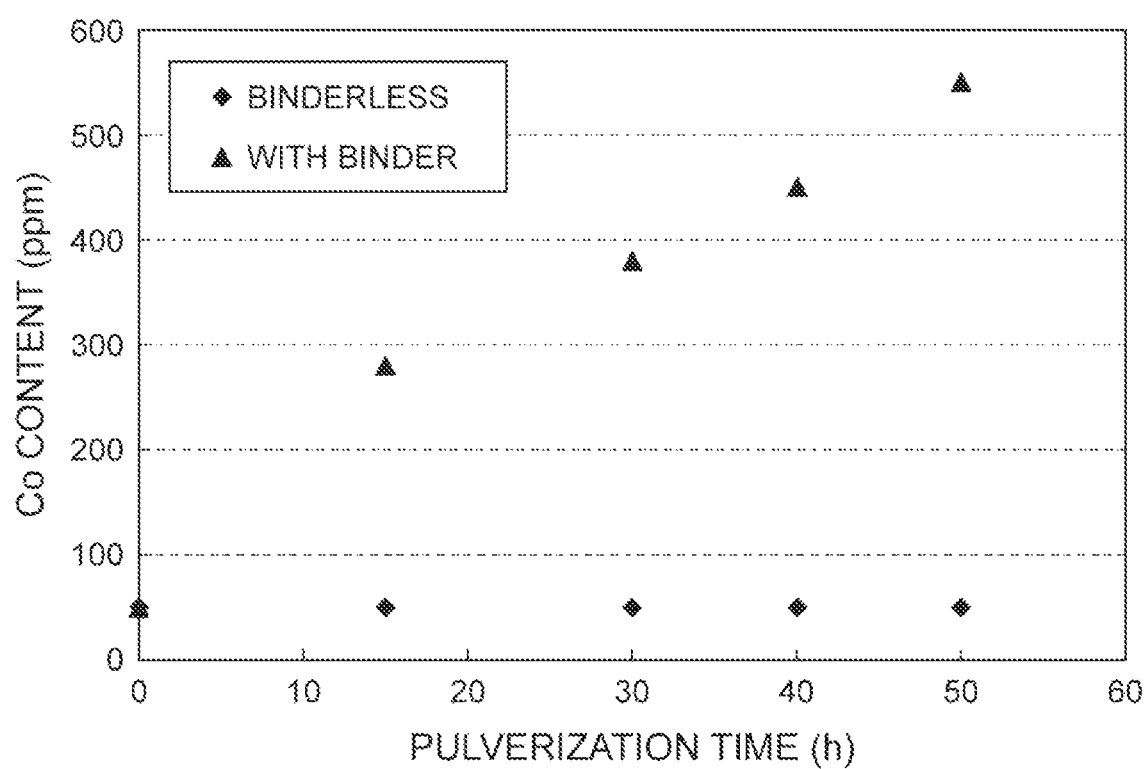
FIG. 2 is a graph showing the relationship between a pulverization time and a Co content after pulverization.

FIG. 2 is a graph showing the relationship between the pulverization time and the Co content after pulverization. As shown in FIG. 2, it was confirmed that the content of Co atoms was increased by pulverization using a cemented carbide ball containing a binder. By such a fabrication method, a plurality of types of raw materials having different Co atom contents were prepared. Similarly, a plurality of types of raw materials having different contents of Ni atoms and Fe atoms were prepared. The raw material of Example 1 was prepared by mixing WC powder containing almost no Co as impurities in a short time without using a cemented carbide ball.

[Fabrication of Sintered Body]

A plurality of types of molding raw materials having different iron group metal contents were prepared by using the raw materials obtained in "Preparation of raw materials" described above. The prepared molding raw material was put in a mold having a predetermined size, and pressed at 100 MPa by using a press machine. In this way, a plurality of molded bodies having different metal contents were fabrication. The respective molded bodies were fired at 2200° C. for 2 hours under vacuum. Thereafter, HIP treatment was performed under the conditions of 1700° C. and 200 MPa to obtain a sintered body of each example. A sintered body containing two or more types of atoms among Co atoms, Ni atoms, and Fe atoms was fabricated using the molding raw material obtained by mixing two or more types of raw materials.

Table 1 summarizes the content of the iron group atoms and the porosity in the sintered bodies of the respective examples. From the results of the X-ray diffraction and the EDX mapping, it was confirmed that the sintered bodies of the respective examples were consisting of the tungsten carbide phase. The content of iron group atoms was analyzed by glow discharge mass spectrometry (GDMS). The porosity was determined by polishing the cross section of the sintered body and performing image analysis on the polished surface.

TABLE 1

|  | Composition of sintered body (numerical value in parentheses is atomic ppm) | Total content of iron group atoms (atomic ppm) | Porosity (% by volume) |
| --- | --- | --- | --- |
| Example 1 | WC—Co(33) | 33 | 1 |
| Example 2 | WC—Co(330) | 330 | <0.5 |
| Example 3 | WC—Co(830) | 830 | <0.5 |
| Example 4 | WC—Co(1700) | 1700 | <0.5 |
| Example 5 | WC—Co(2300) | 2300 | <0.5 |
| Example 6 | WC—Co(3300) | 3300 | <0.5 |
| Example 7 | WC—Ni(330) | 330 | <0.5 |
| Example 8 | WC—Ni(1700) | 1700 | <0.5 |
| Example 9 | WC—Fe(830) | 830 | <0.5 |
| Example 10 | WC—Fe(3300) | 3300 | <0.5 |
| Example 11 | WC—Co(83)—Ni(83) | 166 | <0.5 |
| Example 12 | WC—Co(1300)—Ni(660) | 1960 | <0.5 |
| Example 13 | WC—Co(1650)—Ni(1650) | 3300 | <0.5 |
| Example 14 | WC—Fe(1000)—Co(1000)—Ni(1200) | 3200 | <0.5 |

<Evaluation of Strength>

Each of the sintered bodies of Examples 1 to 14 had conductivity, and the mechanical strength (three-point bending strength) was in a range of 700 to 1800 MPa.

Comparative Examples 1 to 9

Samples (sintered bodies) having compositions shown in Table 2 were fabricated using commercially available powder. Comparative Example 1 is a member made of silicon which is used as various members in the processing container of the plasma processing apparatus. The member made of silicon is easily etched by plasma.

The alumina of Comparative Example 2 is harder to be etched than silicon. However, the corrosion resistance to etching is not sufficient. Comparative Example 3 is a member made of tungsten carbide (content of Co atoms: 15 atomic ppm). The raw material of this sintered body was prepared by selecting powder having a low Co content as the WC powder such that an iron group element was not mixed in during mixing. Tungsten carbide is a hardly sinterable material by itself, and when a sintered body was fabricated under the same conditions as those in the examples, the relative density was 95.6% (porosity: 4.4% by volume).

Comparative Example 4 is a cemented carbide having a relatively low Co content, which is classified as a low cobalt cemented carbide. Comparative Example 5 is a general cemented carbide containing Co as a binder. This sintered body was fabricated in the same procedure as in Examples 1 to 14 except that Co (20.7% by volume in volume ratio) was added as a binder to commercially available tungsten carbide powder and mixed and the sintering temperature was 1450° C. The relative density of the sintered body of Comparative Example 5 was almost 100%. Comparative Example 6 is a general cemented carbide containing Ni as a binder. Comparative Example 7 is a cemented carbide obtained by adding carbide containing the elements of Groups IV to VI of the periodic table as constituent elements to a cemented carbide containing Co as a binder.

Figure 3:
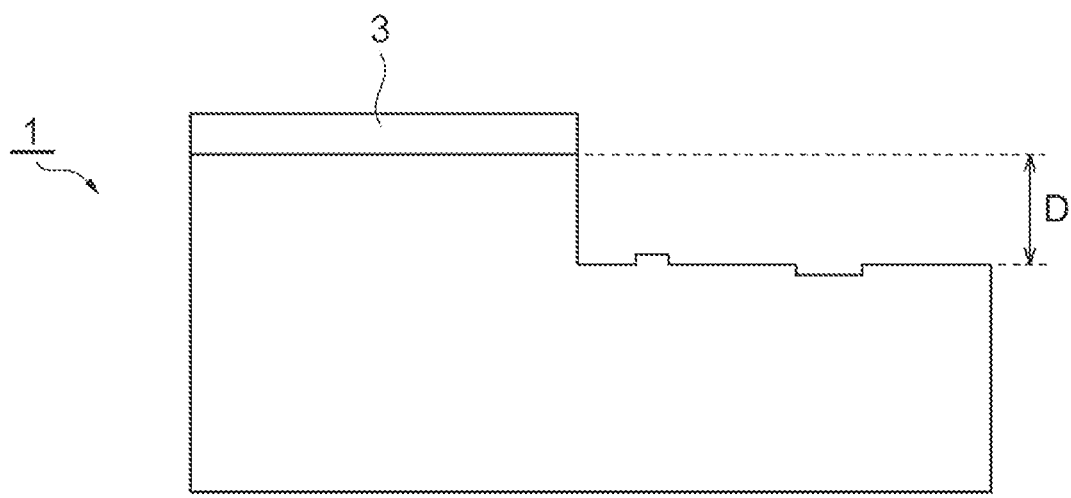
FIG. 3 is a diagram showing an outline of plasma etching processing.

Comparative Example 8 is a sintered body in which carbide containing the elements of Groups IV to VI of the periodic table as constituent elements is contained in tungsten carbide. The raw material of this sintered body was prepared by selecting powder having a low Co content as the WC powder and adding the above-mentioned carbide while preventing mixing-in of iron group elements during mixing. In Comparative Example 8, phases other than the tungsten carbide phase were generated. Comparative Example 9 is a test piece obtained by coating a thermal spray coating of $Y_2O_3$ onto an aluminum base material.

production was used. Further, the etching conditions using $CF_4$ gas plasma were a cathode temperature of 60° C., an anode temperature of 30° C., an RF power source output of 1000 W, a gas pressure in chamber of 16 Pa, an etching time of 60 minutes, and a gas flow rate of 60 sccm. As shown in FIG. 3, the unmasked portion of the surface of the sintered body was etched by the plasma etching processing.

<Etching Depth D>

After the plasma etching processing, the masking tape 3 is peeled off from the surface, and a level difference between the non-etched surface and the etched surface was measured using a contour shape measuring instrument (trade name: Surfcom 2800, manufactured by Tokyo Seimitsu Co., Ltd.) to determine an etching depth D.

The etching depths D in Comparative Examples 1 and 2 were 34 μm and 3.6 μm, respectively. In contrast, the etching depths D in Examples 1 to 14 and Comparative Examples 3, 4, 8, and 9 were all within 1.5 μm. It was confirmed that Examples 1 to 14 had better corrosion resistance than Comparative Examples 1 and 2.

<Number of Particles>

The number of particles after the plasma etching processing was measured using a commercially available particle counter in accordance with JIS B 9921. As a measurement result of the number of particles, the number of particles was about 100 in Comparative Example 1. In contrast, in Examples 1 to 14 and Comparative Example 8, the number of particles ranged from 20 to 100 pieces. In Comparative Examples 3 to 7, the number of particles was more than 100.

TABLE 2

|  | Composition of sintered body (numerical value in parentheses is atomic concentration) | Total content of iron group atoms | Porosity (% by volume) |
|---|---|---|---|
| Comparative Example 1 | Silicon | — | ≤0.5 |
| Comparative Example 2 | $Al_2O_3$ | — | ≤0.5 |
| Comparative Example 3 | WC—Co (15 atomic ppm) | 5 atomic ppm | 4.4 |
| Comparative Example 4 | WC—Co (3 atomic %) | 3 atomic % | — |
| Comparative Example 5 | WC—Co (33 atomic %) | 33 atomic % | ≤0.5 |
| Comparative Example 6 | WC—Ni (20 atomic %) | 20 atomic % | ≤0.5 |
| Comparative Example 7 | WC—Co(30 atomic %)—$Cr_3C_2$(Cr: 10000 atomic ppm)—VC(V: 600 atomic ppm) | 30 atomic % | ≤0.5 |
| Comparative Example 8 | WC—TiC(Ti: 2 atomic %)—TaC(Ta: 3000 atomic ppm) | 5 atomic ppm | ≤0.5 |
| Comparative Example 9 | Aluminum + $Y_2O_3$ thermal spray coating | — | About 5 |

[Evaluation 1 as Member for Plasma Processing Apparatus]

<Plasma Etching Processing>

The evaluation of plasma etching of the sintered bodies (members) of each of the examples and each of the comparative examples was performed in the following procedure. The fabricated sintered body was machined to fabricate an evaluation sample having a size of ϕ30 mm×3 mm. The surface of the evaluation sample was mirror-finished. Then, as shown in FIG. 3, a part of the mirror-finished surface of a sintered body 1 was masked with a masking tape 3 made of Kapton, and plasma etching processing was performed using a plasma processing apparatus.

As the plasma processing apparatus, a parallel plate type reactive ion plasma etching apparatus for 8-inch LSI mass In Comparative Example 3, it is considered that the porosity is high, so that pores on the surface become particle pockets, making it easier to hold particles. Comparative Examples 4 to 7 had a metal phase (Co phase or Ni phase) having a size of several μm or more. These metal phases have lower corrosion resistance than the tungsten carbide phase. For this reason, it is considered that a recess (level difference due to corrosion) is generated between the metal phase and the tungsten carbide phase during the plasma etching processing and this becomes a particle pocket, making it easier to hold a particle. In Comparative Example 9, fine peeling occurred on a part of the surface due to a difference in thermal expansion due to a temperature change.

<Metal Contamination>

The sintered body subjected to the plasma etching was washed with a cleaning solution (hydrofluoric acid). The cleaning solution was analyzed by an ICP-MS method (fusion-coupled plasma mass spectrometry) to evaluate metal contamination. The elements to be analyzed were 13 types of elements; Na, Mg, Al, K, Ca, Ti, Cr, Fe, Co, Ni, Cu, Zn, and W.

In particular, with respect to Cu, Ti, and Ca, which are harmful metal elements that easily contaminate circuits in a semiconductor manufacturing process, samples in which the elements exceed $3 \times 10^{10}$ (atoms/cm$^2$) were determined to be rejected, and with respect to metal elements other than Cu, Ti, Ca, and W, samples in which the elements exceed $20 \times 10^{10}$ (atoms/cm') were determined to be rejected. With respect to W, it was the same as the metal mask component, and had little effect because it was removed in a process in the subsequent step, and thus it was excluded from the evaluation of metal contamination.

The evaluation results of Examples 1 to 14 and Comparative Examples 1, 2, 3, and 9 passed based on the above criteria. With respect to Comparative Examples 4, 5, 6, and 7, a large amount of Co or Ni was detected, and thus the samples were rejected. With respect to the Comparative Example 8, the amount of Ti was large, and thus it was rejected.

Summarizing the above results, in Examples 1 to 14, the etching depth D was sufficiently small, and the number of observed particles was equal to or less than that in Comparative Example 1. Further, the metal contamination was equal to or less than the allowable value. Further, all samples had conductivity, and no peeling occurred in any of the evaluations. On the other hand, in Comparative Example 1, although there was no problem in conductivity, there was a problem in processing into a desired shape due to low strength. Further, the etching depth D was the largest, and the corrosion resistance was insufficient.

In Comparative Example 2, the etching depth D was improved as compared with Comparative Example 1. However, the etching depth D was larger than in Examples 1 to 14. Further, since Comparative Example 2 did not have conductivity, particles tended to be easily attracted by an electrostatic discharge.

In Comparative Example 3, the number of particles could not be sufficiently reduced even by washing. This is considered that a large number of pores existing on the surface and in the interior served as particle pockets.

Comparative Examples 4, 5, and 6 had metal phases such as Co and Ni. It is considered that the metal phase is preferentially etched to generate irregularities, which causes the particle pockets. Further, in the metal contamination, the amounts of Co and Ni greatly exceeded the allowable range. Comparative Example 7 was similar. In Comparative Example 8, since the volume ratios of TiC and TaC were high, Ti and Ta were detected in excess of the allowable amounts.

[Evaluation 2 as Member for Plasma Processing Apparatus]

<Measurement of Number of Particles and Evaluation of Metal Contamination>

The sintered bodies of Example 3, Comparative Examples 1 and 8 were used as the members (edge rings) of the plasma processing apparatus as shown in FIG. 1. Then, a silicon wafer was etched under the same etching conditions as in "Evaluation 1" described above. The silicon wafer after the plasma etching processing was washed with a cleaning solution (hydrofluoric acid). The cleaning solution was analyzed in the same manner as in "metal contamination" described above to evaluate metal contamination. The evaluation results of the metal contamination were as shown in Table 3.

TABLE 3

|    | Example 3 | Comparative Example 1 | Comparative Example 8 |
|----|-----------|----------------------|----------------------|
| Na | 40        | 20                   | <7.4                 |
| Mg | 0.08      | 0.43                 | <7.0                 |
| Al | 5.4       | 4                    | <6.3                 |
| K  | 3.5       | 12                   | <4.4                 |
| Ca | 2.5       | 1.8                  | 9.7                  |
| Ti | 1.3       | 2.8                  | 11000                |
| Cr | 3.5       | 0.22                 | 53                   |
| Fe | 1.9       | 0.59                 | 39                   |
| Co | 3.3       | —                    | 64                   |
| Ni | 0.3       | 0.069                | 4.8                  |
| Cu | 0.8       | 3.1                  | 4.4                  |
| Zn | 0.1       | 1.7                  | <2.6                 |
| W  | 5500      | 0.046                | 10000                |

Unit of numerical values in the table is [$\times 10^{10}$ atoms/cm$^2$].

In Table 3, in a case where the sintered body of Example 3 was used as the member, all elements satisfied the allowable values. Although the content of W was high, since it is a component that can be removed by washing, it does not pose particularly a major problem. On the other hand, in Comparative Example 8, the content of Ti was high.

What is claimed is:
1. A member for a plasma processing apparatus, the member consisting of a sintered body;
   wherein the sintered body comprises a tungsten carbide crystal phase,
   wherein the sintered body includes at least one type of iron group atom selected from the group consisting of a Fe atom, a Co atom, and a Ni atom,
   wherein the sintered body includes a total content of iron group atoms in a range of 30 to 3300 atomic ppm, and
   wherein the sintered body includes a total content of metal atoms other than W, Fe, Co, or Ni that is 1650 atomic ppm or less.
2. The member according to claim 1, wherein a porosity of the sintered body is 2% by volume or less.
3. The member according to a claim 1, wherein a content of each of the Fe atom, the Co atom, and the Ni atom in the sintered body is 1650 atomic ppm or less.
4. A plasma processing apparatus comprising:
   a sintered body;
   wherein the sintered body comprises a tungsten carbide crystal phase,
   wherein the sintered body includes at least one type of iron group atom selected from the group consisting of a Fe atom, a Co atom, and a Ni atom,
   wherein the sintered body includes a total content of iron group atoms in a range of 30 to 3300 atomic ppm.
5. The member according to claim 1,
   wherein the member is configured with at least one component exposed to a plasma processing in the plasma processing apparatus.
6. The member according to claim 1,
   wherein a content of each of the metal atoms other than the W atom, the Fe atom, the Co atom, and the Ni atom is 300 atomic ppm or less.
7. The plasma processing apparatus according to claim 4, wherein a total content of metal atoms other than a W atom, the Fe atom, the Co atom, and the Ni atom is 1650 atomic ppm or less.

8. The plasma processing apparatus according to claim 4, wherein a content of each of metal atoms other than the W atom, the Fe atom, the Co atom, and the Ni atom is 300 atomic ppm or less.

\* \* \* \* \*